United States Patent
Iijima

(10) Patent No.: US 8,372,682 B2
(45) Date of Patent: Feb. 12, 2013

(54) SEMICONDUCTOR DEVICE AND METHOD FOR MANUFACTURING SAME

(75) Inventor: Tadashi Iijima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/346,034

(22) Filed: Jan. 9, 2012

(65) Prior Publication Data
US 2012/0241892 A1 Sep. 27, 2012

(30) Foreign Application Priority Data

Mar. 24, 2011 (JP) ................................. 2011-066693

(51) Int. Cl.
*H01L 31/0232* (2006.01)
(52) U.S. Cl. .................. 438/65; 257/432; 257/E31.127
(58) Field of Classification Search .................. 257/432, 257/E31.127, E31.117; 438/64, 65, 66, 68, 438/975
See application file for complete search history.

(56) References Cited

U.S. PATENT DOCUMENTS
2012/0091555 A1 * 4/2012 Nakasaki .................... 257/522

FOREIGN PATENT DOCUMENTS
| JP | 4-206925 | 7/1992 |
| JP | 2000-252354 | 9/2000 |
| JP | 2002-164521 | 6/2002 |

* cited by examiner

*Primary Examiner* — Zandra Smith
*Assistant Examiner* — Paul Patton
(74) *Attorney, Agent, or Firm* — Oblon, Spivak, McClelland, Maier & Neustadt, L.L.P.

(57) ABSTRACT

In a method for manufacturing a semiconductor device according to an embodiment, a trench is formed in an outer peripheral portion of a chip region on a bonding surface of a support substrate, and a semiconductor substrate having a chip ring in the outer peripheral portions of the chip regions on an inside of a dicing line respectively and the support substrate are bonded to position the trench from above the chip ring to the inside of the dicing line. In the method for manufacturing a semiconductor device, furthermore, the semiconductor substrate and the support substrate which are bonded to each other are subjected to dicing along the dicing line.

18 Claims, 9 Drawing Sheets

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2011-066693, filed on Mar. 24, 2011; the entire contents of which are incorporated herein by reference.

FIELD

An embodiment described herein relates generally to a semiconductor device and a method for manufacturing the same.

BACKGROUND

In recent years, attention is paid to a market for a small-sized camera module in an application to a digital still camera or a portable telephone having a camera. An image pickup device such as a CCD or a CMOS image sensor which is to be used in a camera module has a sensor performance enhanced with progress in fineness of the semiconductor technology. As one of techniques for enhancing the sensor performance, there is proposed a backside-illumination type CMOS image sensor which improves sensitivity or advanced shading.

In manufacture of the backside-illumination type CMOS image sensor, a photoelectric converting layer and a wiring layer are formed on a semiconductor substrate and a support substrate is then bonded onto the wiring layer, and a back side of the semiconductor substrate is thereafter subjected to etching.

DETAILED DESCRIPTION

In a method for manufacturing a semiconductor device according to an embodiment, a trench is formed in an outer peripheral portion of a chip region on a bonding surface of a support substrate, and a semiconductor substrate having a chip ring in the outer peripheral portions of the chip regions on an inside of a dicing line respectively and the support substrate are bonded to position the trench from above the chip ring to the inside of the dicing line. In the method for manufacturing a semiconductor device, furthermore, the semiconductor substrate and the support substrate which are bonded to each other are subjected to dicing along the dicing line.

With reference to the accompanying drawings, a semiconductor device and a method for manufacturing the same according to the embodiment will be described below in detail. The present invention is not restricted to the embodiment.

EMBODIMENT

A method for manufacturing a semiconductor device according to an embodiment will be described with reference to FIGS. 1A to 6 to be sectional views illustrating respective steps.

Figure 1A:
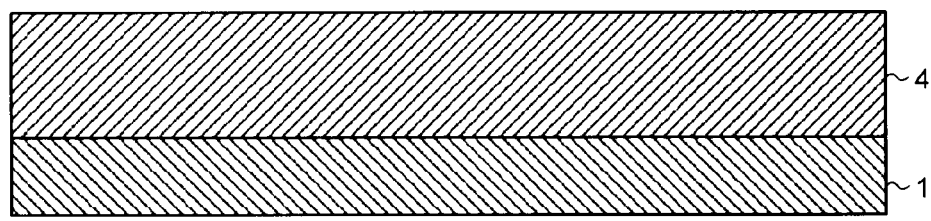
FIGS. 1A to 1D are sectional views illustrating each step in a method for manufacturing a semiconductor device according to an embodiment.

In FIG. 1A, an N-type semiconductor layer 4 is epitaxially grown on a semiconductor substrate 1 to be a bulk epitaxial substrate. Although a P-type semiconductor layer may be epitaxially grown on the semiconductor substrate 1, description will be given to the case in which the N-type semiconductor layer 4 is formed as an example.

Figure 1B:
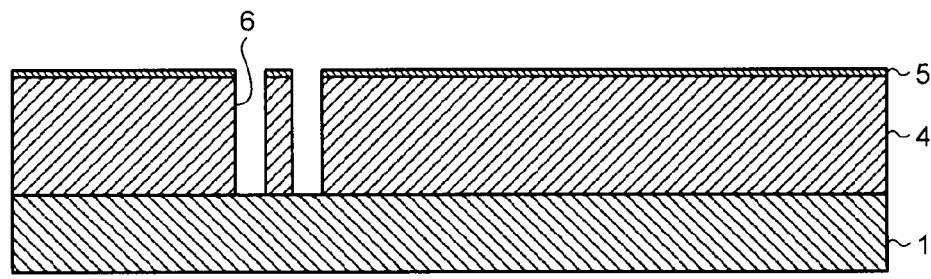

As illustrated in FIG. 1B, next, a stopper layer 5 is provided on a whole surface of the N-type semiconductor layer 4 by a method such as CVD. By using photolithography and dry etching, then, a through hole 6 is formed on the stopper layer 5 and the N-type semiconductor layer 4. For example, a silicon nitride film can be used for a material of the stopper layer 5.

Figure 1C:
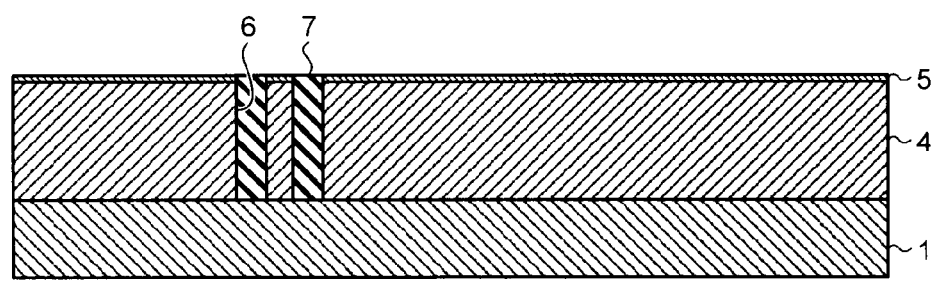

As illustrated in FIG. 1C, subsequently, a through hole insulating layer 7 is provided on a whole surface of the stopper layer 5 to fill in the through hole 6 by a method such as CVD. Then, the through hole insulating layer 7 is thinned by using a method such as CMP to remove the through hole insulating layer 7 provided on the stopper layer 5. A silicon oxide film can be used for a material of the through hole insulating layer 7.

Figure 1D:
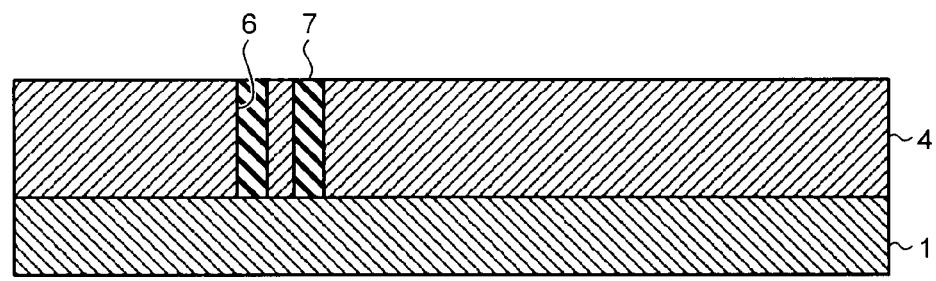

As illustrated in FIG. 1D, thereafter, the stopper layer 5 is subjected to etching so that the stopper layer 5 is removed from the N-type semiconductor layer 4. It is preferable that wet etching should be used to prevent the surface of the N-type semiconductor layer 4 from being damaged when removing the stopper layer 5 from the N-type semiconductor layer 4.

Figure 2A:
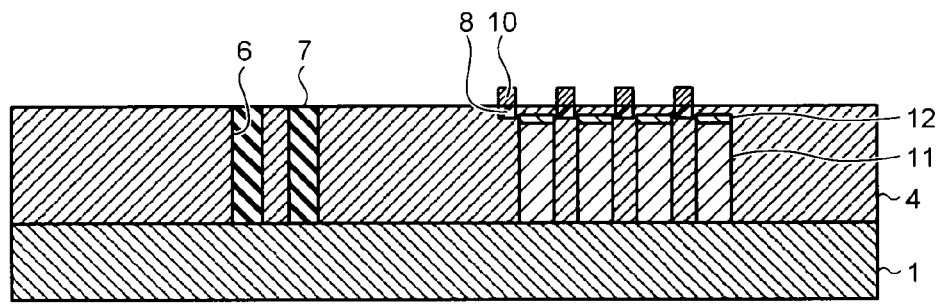
FIGS. 2A to 2D are sectional views illustrating each step in the method for manufacturing a semiconductor device according to the embodiment.

As illustrated in FIG. 2A, next, an element isolating layer 8 disposed between pixels is embedded in the surface side of the N-type semiconductor layer 4 and a gate electrode 10 is then formed on the N-type semiconductor layer 4 for every pixel. For example, a silicon oxide film can be used for a material of the element isolating layer 8 and a polycrystalline silicon film can be used for a material of the gate electrode 10.

Thereafter, an impurity ion such as P or As is implanted into the N-type semiconductor layer 4 to form an N-type impurity introduced layer 11 in a deep position of the N-type semiconductor layer 4. Moreover, an impurity ion such as B is implanted into the N-type semiconductor layer 4 to form a P-type impurity introduced layer 12 in a shallow position of the N-type semiconductor layer 4. The P-type impurity introduced layer 12 is formed on the N-type impurity introduced layer 11 so that a photodiode is formed as a photoelectric converting portion for every pixel.

Before the gate electrode 10 is formed on the N-type semiconductor layer 4, the N-type impurity introduced layer 11 and the P-type impurity introduced layer 12 may be formed on the N-type semiconductor layer 4.

Figure 2B:
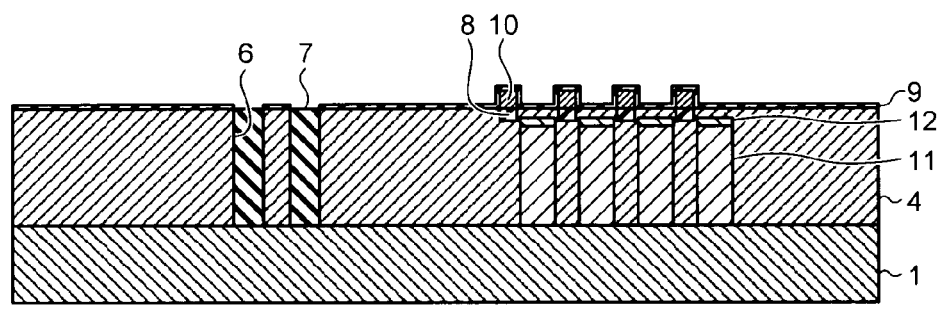

As illustrated in FIG. 2B, subsequently, an insulating film 9 is formed on the surface of the N-type semiconductor layer 4 by thermal oxidation or CVD. A thickness of the insulating film 9 can be set to be approximately 5 to 6 nm. An impurity to be used for an ion implantation at this time can be Si, Ge, C, B or In, for example. By forming the silicon oxide film 9 before implanting the ion into the surface layer of the N-type semiconductor layer 4 and the N-type impurity introduced layer 11, moreover, it is possible to uniformly carry out the ion implantation.

Figure 2C:
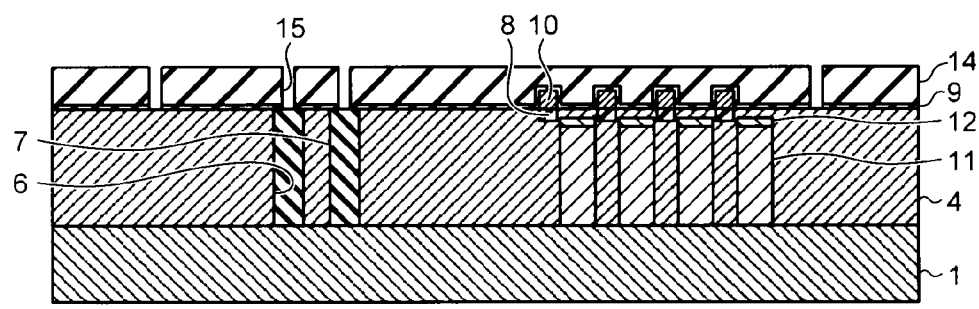

As illustrated in FIG. 2C, next, an interlayer insulating layer 14 is provided on a whole surface of the N-type semiconductor layer 4 by a method such as CVD. By using photolithography and dry etching, then, an opening portion 15 for exposing the through hole insulating layer 7 is formed on the insulating film 9 and the interlayer insulating layer 14. The opening portion 15 can also be formed for a chip ring 41 which will be described below in a portion other than the through hole insulating layer 7. For example, a silicon oxide film can be used for a material of the interlayer insulating layer 14. In the case in which the insulating film 9 and the interlayer insulating layer 14 are formed by the same material, moreover, the insulating film 9 and the interlayer insulating layer 14 can be formed integrally.

Figure 2D:
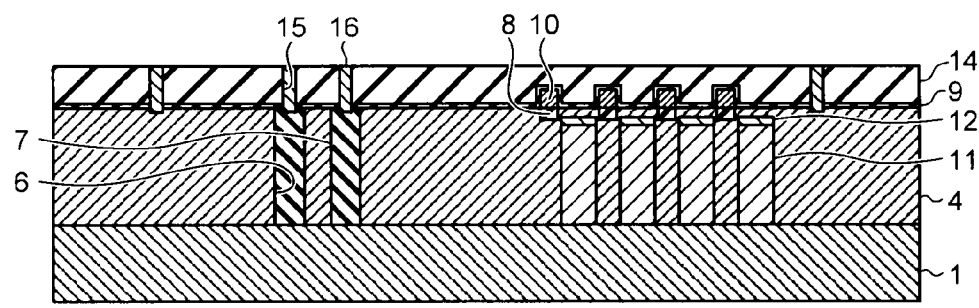

As illustrated in FIG. 2D, thereafter, an embedded electrode 16 is formed on the whole surface of the interlayer insulating layer 14 to fill in the opening portion 15 by a method such as CVD. Similarly, the opening portion 15 for the chip ring 41 is also filled in. Subsequently, the embedded electrode 16 is thinned through a method such as CMP to remove the embedded electrode 16 provided on the interlayer insulating layer 14. For example, it is possible to use W, Al, Cu or the like for a material of the embedded electrode 16.

Figure 3A:
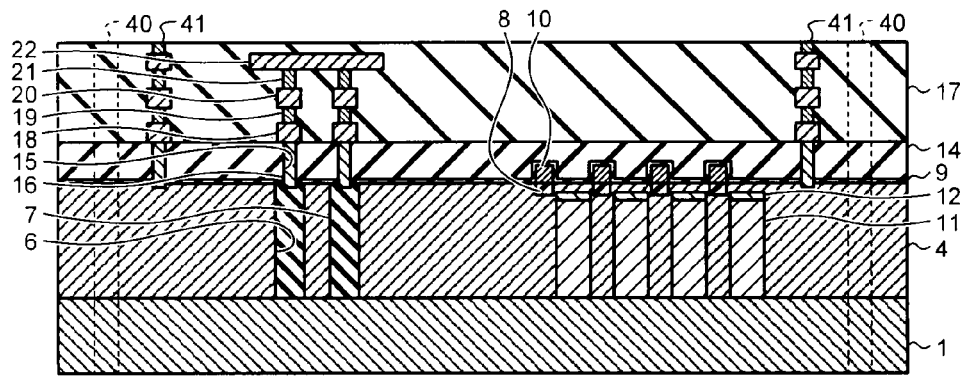
FIGS. 3A to 3D are sectional views illustrating each step in the method for manufacturing a semiconductor device according to the embodiment.

As illustrated in FIG. 3A, next, an interlayer insulating layer 17 is provided on a whole surface of the interlayer insulating layer 14 by a method such as CVD, and wirings 18, 20 and 22 and embedded electrodes 19 and 21 which are embedded in the interlayer insulating layer 17 are formed. For example, a silicon oxide film can be used for a material of the interlayer insulating layer 14, Al or Cu can be used for materials of the wirings 18, 20 and 22, and W, Al, Cu or the like can be used for materials of the embedded electrodes 19 and 21. Moreover, the chip ring 41 constituted by a wiring and a via in the same manner is formed in an outer peripheral portion simultaneously with the formation of the wirings 18, 20 and 22 and the embedded electrodes 19 and 21. The chip ring 41 is provided on an inside of a dicing line 40 illustrated in a dot line and serves to inhibit moisture from entering an inner part of the chip from an outside or to prevent a crack from being generated on the chip.

Figure 3B:
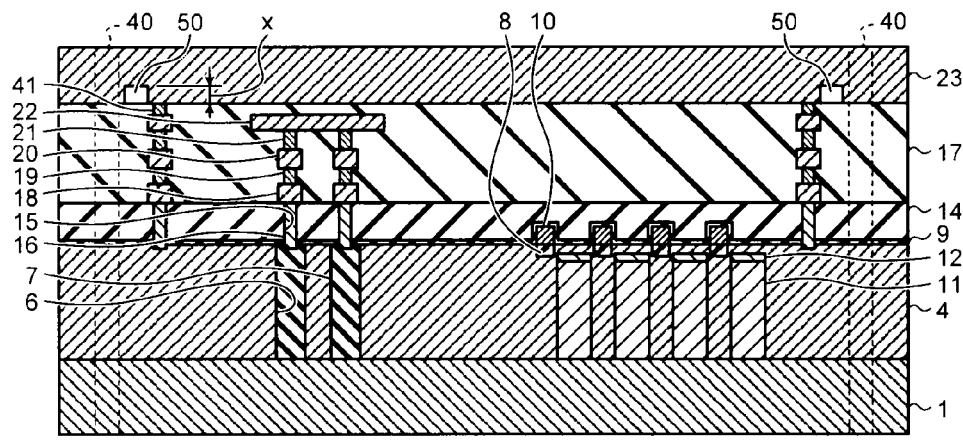
Figure 7:
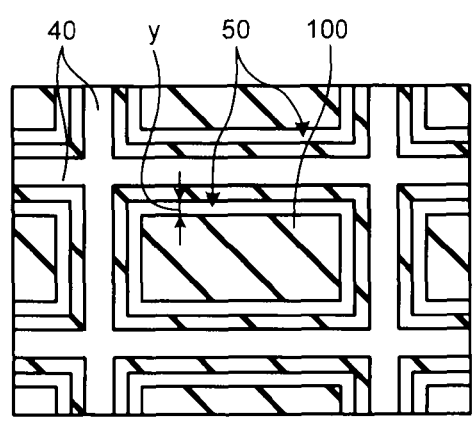
FIG. 7 is a top view illustrating a positional relationship among a chip, a dicing line and a trench according to the embodiment.

As illustrated in FIG. 3B, next, a support substrate 23 is bonded onto the interlayer insulating layer 17 through sticking. In the present embodiment, a trench 50 is formed along the chip ring 41 on a bonding surface of the support substrate 23. It is sufficient that a depth x of the trench 50 is approximately 10 μm. The trench 50 may be formed between the chip ring 41 of the support substrate 23 and the dicing line 40. Although a chip area is increased, moreover, the trench 50 may be formed on an inside of the chip ring 41. FIG. 7 is a top view illustrating a positional relationship among a chip 100, the dicing line 40 and the trench 50 at this time. Thus, the trench 50 is formed in an outer peripheral portion of the chip 100. It is sufficient that a width y of the trench 50 illustrated in FIG. 7 is approximately 100 μm or less. Before the support substrate 23 is stuck onto the interlayer insulating layer 17, respective wafers are activated through an execution of an $N_2$ plasma treatment and cleaning using ultrasonic waves to remove dust on a surface is carried out. Then, an alignment of the wafers is carried out and the wafers are superposed, and the whole surfaces are bonded to each other with a bonding start point of 2 nm or less. In order to cause interface bonding to be stronger Si—O bonding, then, annealing is carried out in the $N_2$ atmosphere at 300 degrees for approximately two hours.

A semiconductor substrate such as Si may be used for a material of the support substrate 23, for example, and an insulating substrate formed of glass, ceramic or resin may be used. Moreover, an interface of the wafers to be bonded together may have an insulating film formed of Si, $SiO_2$, SiN or the like or a metal surface formed of Cu, Al or the like. In the case in which Si or the like is used as the support substrate 23, it is sufficient to carry out patterning by lithography before bonding, thereby forming the trench 50 because a silicon oxide film is formed on the bonding surface side. After the bonding, a space is formed by the trench 50 over the wafer interface so that a buffering action of a wafer distortion can be obtained. By disposing the trench 50 in the outer peripheral portion of the chip on which a stress concentrates as described above, it is possible to absorb the wafer distortion into the space more effectively.

Figure 3C:
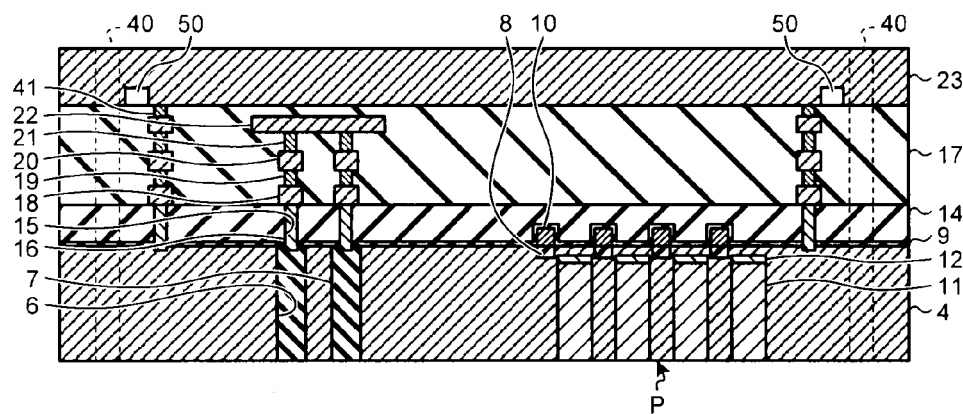

As illustrated in FIG. 3C, next, the semiconductor substrate 1 is thinned by etching or selective etching using hydrofluoric-nitric acid to remove the semiconductor substrate 1. Since a stopper layer is not provided, the semiconductor substrate 1 is removed to have a desirable film thickness by a film thickness control. Consequently, a light incident surface P is provided on a back face of the N-type semiconductor layer 4.

Figure 3D:
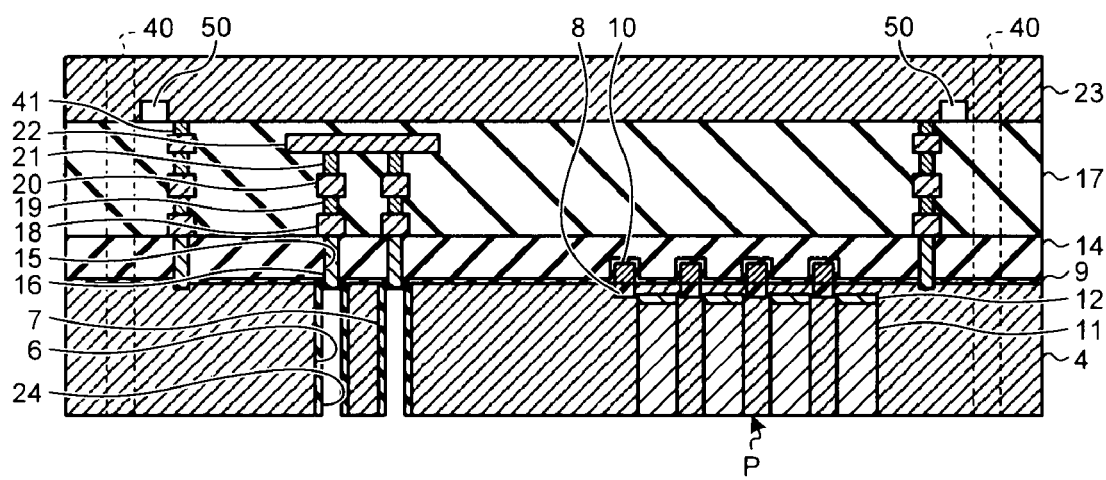

As illustrated in FIG. 3D, subsequently, an opening portion 24 for exposing the embedded electrode 16 is formed on the through hole insulating layer 7 by using photolithography and dry etching. At this time, the through hole insulating layer 7 can be left on a side surface of the through hole 6.

Figure 4A:
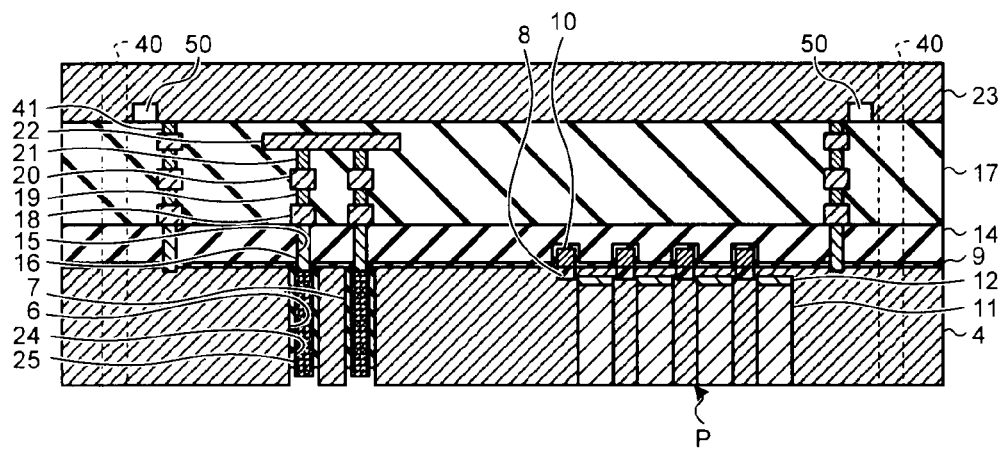
FIGS. 4A to 4D are sectional views illustrating each step in the method for manufacturing a semiconductor device according to the embodiment.

As illustrated in FIG. 4A, then, a through electrode 25 is formed on the back face to fill in the opening portion 24 by a method such as plating or CVD. For example, W, Al, Cu or the like can be used for a material of the through electrode 25.

Figure 4B:
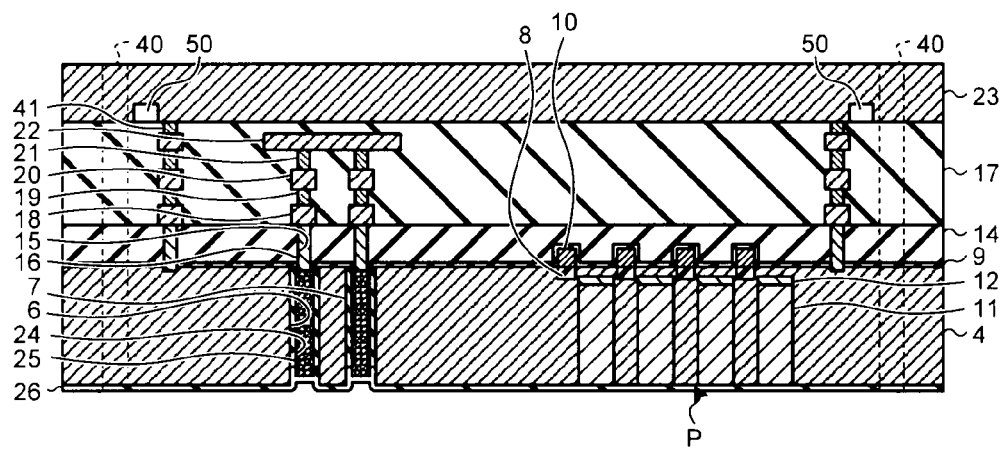

As illustrated in FIG. 4B, thereafter, an insulating layer 26 is formed on the back face of the N-type semiconductor layer 4 by a method such as CVD. For example, a silicon oxide film can be used for a material of the insulating layer 26.

Figure 4C:
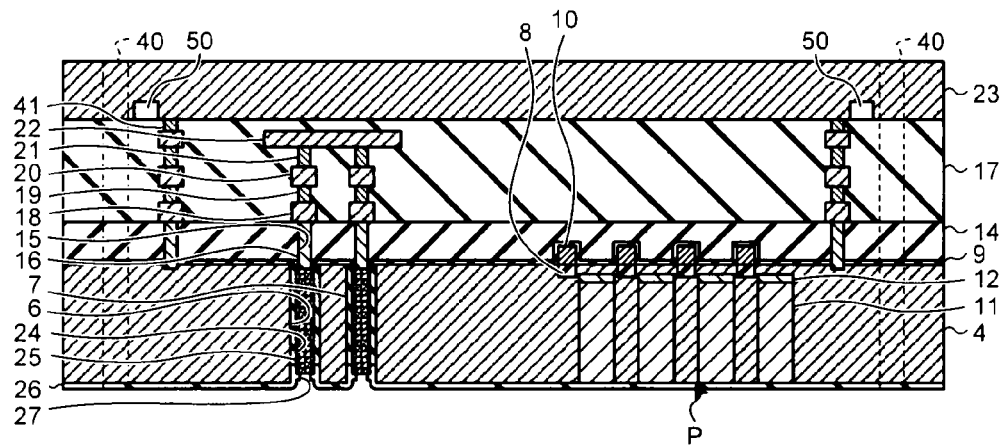

As illustrated in FIG. 4C, next, an opening portion 27 for exposing the through electrode 25 is formed on the insulating layer 26 by using the photolithography and the etching.

Figure 4D:
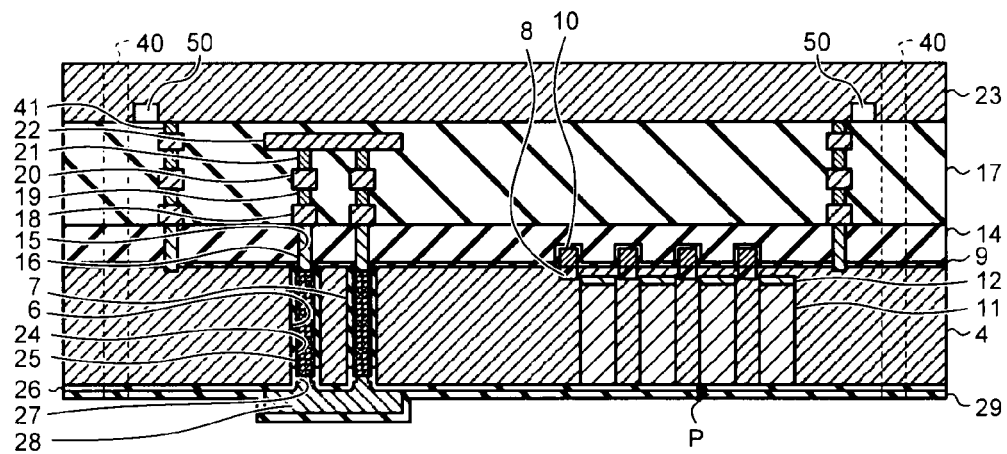

As illustrated in FIG. 4D, subsequently, a pad electrode 28 connected to the through electrode 25 via the opening portion 27 is formed on the insulating layer 26. Then, an insulating layer 29 is formed on a whole surface of the insulating layer 26 by a method such as CVD. For example, a silicon oxide film can be used for a material of the insulating layer 29.

Figure 5A:
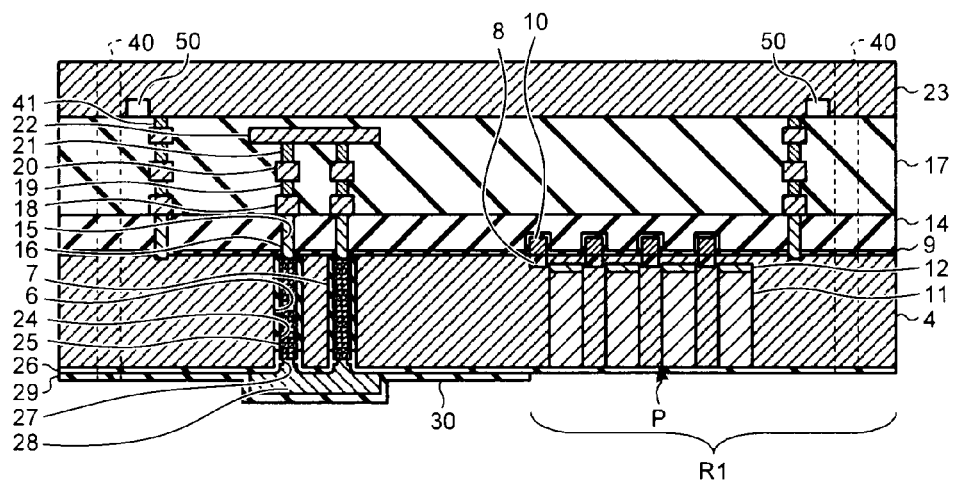
FIGS. 5A to 5C are sectional views illustrating each step in the method for manufacturing a semiconductor device according to the embodiment.

As illustrated in FIG. 5A, thereafter, an opening portion 30 for exposing a pixel region R1 on the back face of the N-type semiconductor layer 4 is formed on the insulating layer 29 by using the photolithography and the dry etching.

Figure 5B:
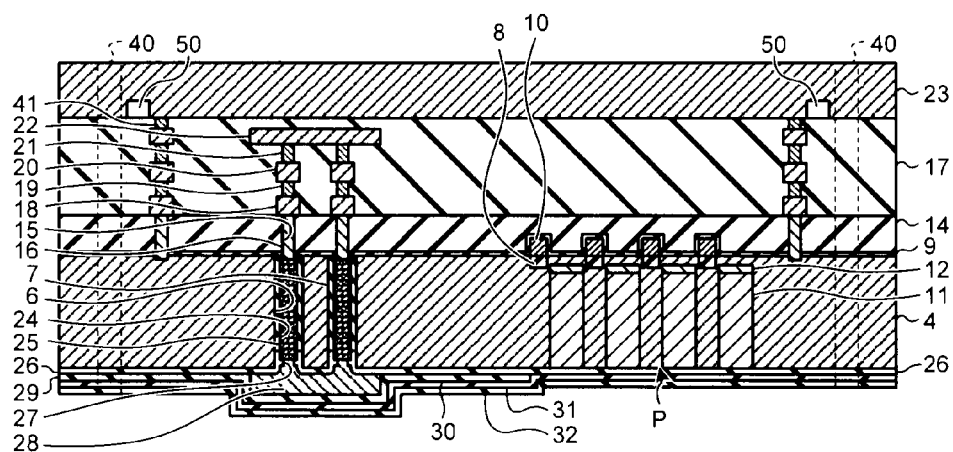

As illustrated in FIG. 5B, next, antireflection films 31 and 32 are formed on the back face side of the N-type semiconductor layer 4 in sequence by using a method such as CVD or sputtering. For example, a silicon oxide film can be used for materials of the antireflection films 31 and 32. At this time, refractive indices of the antireflection films 31 and 32 can be caused to be different from each other.

Figure 5C:
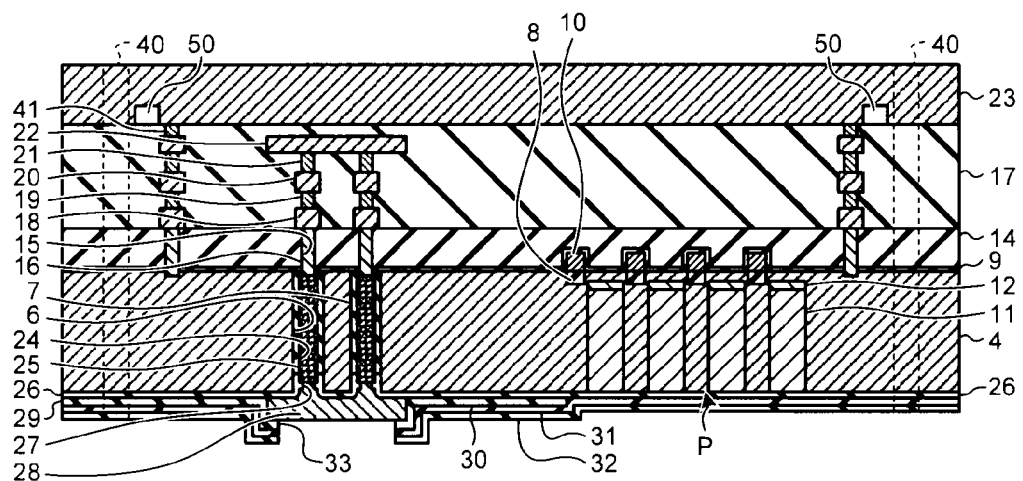

As illustrated in FIG. 5C, subsequently, an opening portion 33 for exposing the pad electrode 28 is formed on the antireflection films 31 and 32 by using the photolithography and the dry etching.

Figure 6:
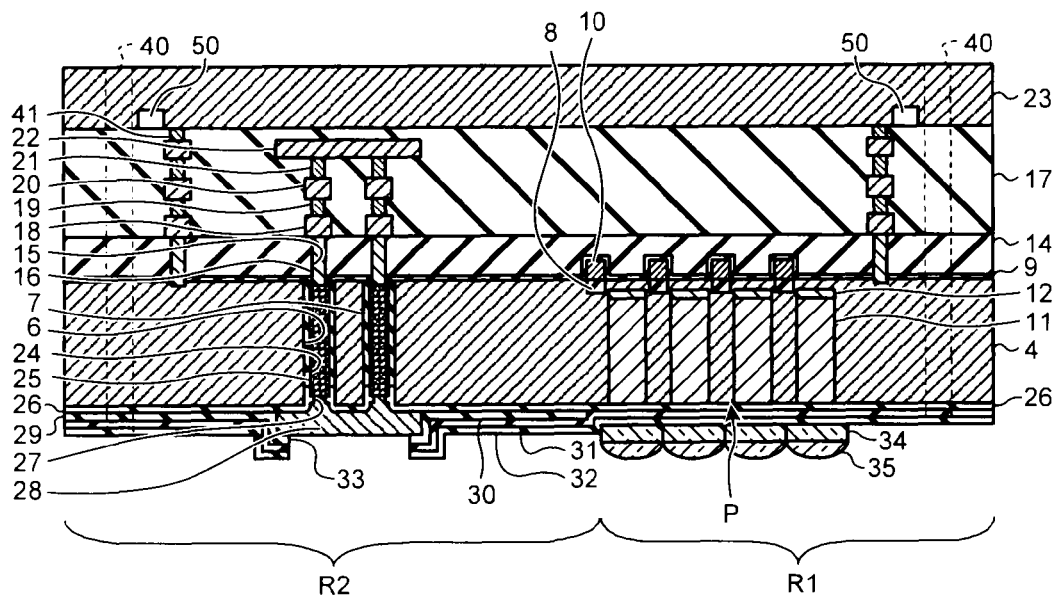
FIG. 6 is a sectional view illustrating each step in the method for manufacturing a semiconductor device according to the embodiment.

As illustrated in FIG. 6, finally, a color filer 34 is formed on the antireflection film 32 for every pixel and an on-chip lens 35 is then formed on the color filter 34 for every pixel. For example, a transparent organic compound can be used for materials of the color filter 34 and the on-chip lens 35. At this time, the color filter 34 can be colored in red, green or blue, for example. At a final step, then, the support substrate 23 is polished from an upper part in FIG. 6 to have a thickness of approximately 200 µm, thereby carrying out cutting along the dicing line 40. Thus, a CMOS image sensor die (chip) is fabricated.

As described above, referring to the wafer bonding technique in the semiconductor device and the method for manufacturing the same according to the present embodiment, an air gap (a trench) for previously releasing a distortion is formed on any of the wafers. The space is left as a space which is not stuck after the bonding. Consequently, the wafer distortion in the sticking of the wafer is relieved and a stress remaining in the sticking is released. Therefore, a misalignment can be suppressed. Consequently, it is possible to solve a problem in that the wafer itself is distorted, resulting in a distortion of a region subjected to patterning in advance to cause a patterning misalignment at a next step, particularly, in a manufacture of a backside-illumination type CMOS image sensor. Thus, it is possible to expect an enhancement in a yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a trench in an outer peripheral portion of a chip region on a bonding surface of a support substrate;
    bonding a semiconductor substrate including a chip ring in the outer peripheral portions of the chip regions on an inside of a dicing line respectively and the support substrate to position the trench from above the chip ring to the inside of the dicing line; and
    dicing the semiconductor substrate and the support substrate which are bonded to each other along the dicing line.

2. The method for manufacturing a semiconductor device according to claim 1, wherein a width in an inward direction of the bonding surface of the trench is set to be 100 µm or less and a depth in a perpendicular direction to the bonding surface is set to be 10 µm or less.

3. The method for manufacturing a semiconductor device according to claim 1, further comprising forming a layer including a photoelectric converting portion and a wiring layer on the semiconductor substrate in sequence before the bonding,
    a top part of the wiring layer being set to be a bonding surface of the semiconductor substrate.

4. The method for manufacturing a semiconductor device according to claim 2, further comprising forming a layer including a photoelectric converting portion and a wiring layer on the semiconductor substrate in sequence before the bonding,
    a top part of the wiring layer being set to be a bonding surface of the semiconductor substrate.

5. The method for manufacturing a semiconductor device according to claim 1, wherein the semiconductor substrate and the support substrate are subjected to an $N_2$ plasma treatment together before the bonding after the trench is formed.

6. The method for manufacturing a semiconductor device according to claim 2, wherein the semiconductor substrate and the support substrate are subjected to an $N_2$ plasma treatment together before the bonding after the trench is formed.

7. The method for manufacturing a semiconductor device according to claim 1, wherein a surface on an opposite side to a surface of the semiconductor substrate which is to be bonded is subjected to etching before the dicing after the bonding.

8. The method for manufacturing a semiconductor device according to claim 2, wherein a surface on an opposite side to a surface of the semiconductor substrate which is to be bonded is subjected to etching before the dicing after the bonding.

9. The method for manufacturing a semiconductor device according to claim 3, wherein the chip ring is formed on the wiring layer.

10. The method for manufacturing a semiconductor device according to claim 4, wherein the chip ring is formed on the wiring layer.

11. The method for manufacturing a semiconductor device according to claim 3, wherein an antireflection film, a color filter and an on-chip lens are formed on a surface of the layer including the photoelectric converting portion at an opposite side to the bonding surface in sequence before the dicing after the bonding.

12. The method for manufacturing a semiconductor device according to claim 4, wherein an antireflection film, a color filter and an on-chip lens are formed on a surface of the layer including the photoelectric converting portion at an opposite side to the bonding surface in sequence before the dicing after the bonding.

13. A semiconductor device comprising:
    a first semiconductor substrate including a chip ring in an outer peripheral portion; and
    a second semiconductor substrate bonded at a bonding surface on a lower side of the first semiconductor substrate and including a trench which is not bonded to the first semiconductor substrate along the chip ring.

14. The semiconductor device according to claim 13, wherein a width in an inward direction of the bonding surface of the trench is equal to or smaller than 100 µm and a depth in a perpendicular direction to the bonding surface is equal to or smaller than 10 µm.

15. The semiconductor device according to claim 13, wherein the first semiconductor substrate includes a wiring layer, a layer having a photoelectric converting portion, an antireflection film, a color filter and an on-chip lens in sequence on the bonding surface.

16. The semiconductor device according to claim 14, wherein the first semiconductor substrate includes a wiring layer, a layer having a photoelectric converting portion, an antireflection film, a color filter and an on-chip lens in sequence on the bonding surface.

17. A backside-illumination type CMOS image sensor comprising the semiconductor device according to claim 15.

18. A backside-illumination type CMOS image sensor comprising the semiconductor device according to claim 16.

* * * * *